(12) United States Patent
Yen et al.

(10) Patent No.: US 11,973,010 B2
(45) Date of Patent: Apr. 30, 2024

(54) CHIP PACKAGING METHOD AND CHIP PACKAGE UNIT

(71) Applicant: Richtek Technology Corporation, Zhubei (TW)

(72) Inventors: Hao-Lin Yen, Taoyuan (TW); Heng-Chi Huang, Hsinchu (TW); Yong-Zhong Hu, Cupertino, CA (US)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 293 days.

(21) Appl. No.: 17/490,038

(22) Filed: Sep. 30, 2021

(65) Prior Publication Data

US 2022/0181238 A1    Jun. 9, 2022

Related U.S. Application Data

(60) Provisional application No. 63/121,848, filed on Dec. 4, 2020.

(30) Foreign Application Priority Data

Mar. 18, 2021  (TW) ................. 110109778

(51) Int. Cl.
  *H01L 21/78*   (2006.01)
  *H01L 21/48*   (2006.01)
  *H01L 21/56*   (2006.01)
  *H01L 23/31*   (2006.01)
  *H01L 23/495*  (2006.01)

(52) U.S. Cl.
  CPC .... *H01L 23/49568* (2013.01); *H01L 21/4825* (2013.01); *H01L 21/565* (2013.01); *H01L 21/78* (2013.01); *H01L 23/3114* (2013.01); *H01L 23/49503* (2013.01); *H01L 23/4952* (2013.01)

(58) Field of Classification Search
  None
  See application file for complete search history.

(56) References Cited

U.S. PATENT DOCUMENTS

| | | | |
|---|---|---|---|
| 7,355,289 B2 | 4/2008 | Hess et al. | |
| 9,812,402 B2 | 11/2017 | Awujoola et al. | |
| 9,984,992 B2 | 5/2018 | DeLaCruz et al. | |
| 2005/0104222 A1* | 5/2005 | Jeong | H05K 3/3436 257/784 |
| 2006/0060636 A1* | 3/2006 | Daves | H05K 3/303 228/180.22 |

(Continued)

*Primary Examiner* — Jay C Chang
(74) *Attorney, Agent, or Firm* — Tung & Associates

(57) ABSTRACT

A chip packaging method includes: providing a wafer, on which multiple bumps are formed; cutting the wafer into multiple chip units, wherein multiple vertical heat conduction elements are formed on the wafer or the chip units; disposing the chip units on a base material; and providing a package material to encapsulate lateral sides and a bottom surface of each of the chip units, to form a chip package unit, wherein the bottom surface of the chip unit faces the base material; wherein, in the chip package unit, the bumps on the chip units abut against the base material, and wherein the vertical heat conduction elements directly connect to the base material, or the base material includes multiple through-holes and the vertical heat conduction elements pass through the multiple through-holes in the base material.

12 Claims, 7 Drawing Sheets

(56) References Cited

U.S. PATENT DOCUMENTS

2013/0043595 A1 2/2013 Williams
2014/0110840 A1* 4/2014 Wojnowski ............. H01Q 9/16
                                                                             257/738

* cited by examiner

CHIP PACKAGING METHOD AND CHIP PACKAGE UNIT

CROSS REFERENCE

The present invention claims priority to TW 110109778 filed on Mar. 18, 2021, and provisional application 63/121,848 filed on Dec. 4, 2020.

BACKGROUND OF THE INVENTION

Field of Invention

The present invention relates to a chip packaging method, in particular to the chip packaging method that forms multiple vertical heat conduction elements to improve the heat dissipation capability for the chip unit

Description of Related Art

FIG. 1 shows a chip unit package according to U.S. Pat. No. 9,984,992, in which two chip units are packaged. The lower chip unit CH is disposed on the base material 110 and inside a Faraday cage formed by plural wirings 100 and the other chip, which provides electromagnetic protection. The wirings 100 are disposed on the base material 110 and connected to the circuit/wirings embedded in the base material 110, and the wirings 100 are encapsulated in the package material 120, for resisting electromagnetic interference.

FIG. 2 shows a prior art chip package structure according to U.S. Pat. No. 9,812,402. Similarly to FIG. 1, the wirings 100 and the conductive films 115 in FIG. 2 form a Faraday cage, wherein the wirings 100 are connected to the circuit/wirings embedded in the base material 110, to provide an electromagnetic protection structure for resisting electromagnetic interference.

FIG. 3 shows a prior art chip package structure according to U.S. Pat. No. 7,355,289. In order to improve the heat conduction from the chip unit CH, plural wirings 100 are formed on the chip unit CH, wherein one end of each of the wirings 100 is exposed outside of the package material 120 above the chip unit CH. However, the heat dissipation improvement is limited because the wirings 100 are far away from the bottom plate and the exposed areas of the wirings 100 to the outside are too small. Besides, the wirings need to follow wire bond rules and there is not too much flexibility left for the layout of the wirings for heat dissipation.

In view of the prior art, the present invention provides a chip unit packaging technology, which has the benefits of good heat dissipation capability, easy manufacture, and broad application range.

SUMMARY OF THE INVENTION

In one perspective, the present invention provides a chip packaging method capable of solving the aforementioned problems in the prior art. This chip packaging method includes: providing a wafer, on which multiple bumps are formed; cutting the wafer into multiple chip units, wherein multiple vertical heat conduction elements are formed on the wafer or the chip units; disposing the chip units on a base material; and providing a package material to encapsulate lateral sides and a bottom surface of each of the chip units, to form a chip package unit, wherein the bottom surface of the chip unit faces the base material; wherein, in the chip package unit, the bumps on the chip units abut against the base material, and wherein the vertical heat conduction elements directly connect to the base material, or the base material includes multiple through-holes and the vertical heat conduction elements pass through the multiple through-holes in the base material.

In some embodiments, the steps of cutting the wafer into multiple chip units, wherein multiple vertical heat conduction elements are formed on the wafer or the chip units, and disposing the chip units on a base material, are performed according to one of the following orders: (1) first cutting the wafer into the multiple chip units; next forming the multiple vertical heat conduction elements on each of the chip units; and next flipping the chip units and disposing the chip units on the base material; (2) first forming the multiple vertical heat conduction elements on the wafer; next cutting the wafer into the multiple chip units, wherein each of the chip units includes plural vertical heat conduction elements; and next flipping the chip units and disposing the chip units on the base material; or (3) cutting the wafer into the multiple chip units; next disposing the chip units on the base material; and next flipping the chip units and provide the multiple vertical heat conduction elements to connect to the base material.

In one embodiment, the vertical heat conduction elements are lead wires formed on the wafer or the chip units by wire bonding, and the lead wires are pulled or straightened up in a vertical direction of the chip unit. In one embodiment, the vertical heat conduction elements are lead wires formed on pads of the chip unit, wherein the pads are no connection pads by which no signal or power transmission is performed.

In one embodiment, the chip unit is mounted on the base material by flip chip technology. In one embodiment, the base material is a lead frame.

In another perspective, the present invention provides a chip package unit, including: a lead frame, including multiple through-holes; a chip unit disposed on the lead frame, the chip unit including multiple bumps and multiple vertical heat conduction elements, wherein the vertical heat conduction elements pass through the multiple through-holes in the lead frame or directly connect the lead frame, and wherein the bumps and the vertical heat conduction elements are formed on the same side of the chip unit; and a package material, encapsulating lateral sides and a bottom surface of the chip unit, wherein the bottom surface faces the lead frame.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the components, but not drawn according to actual scale thereof.

Figure 1:
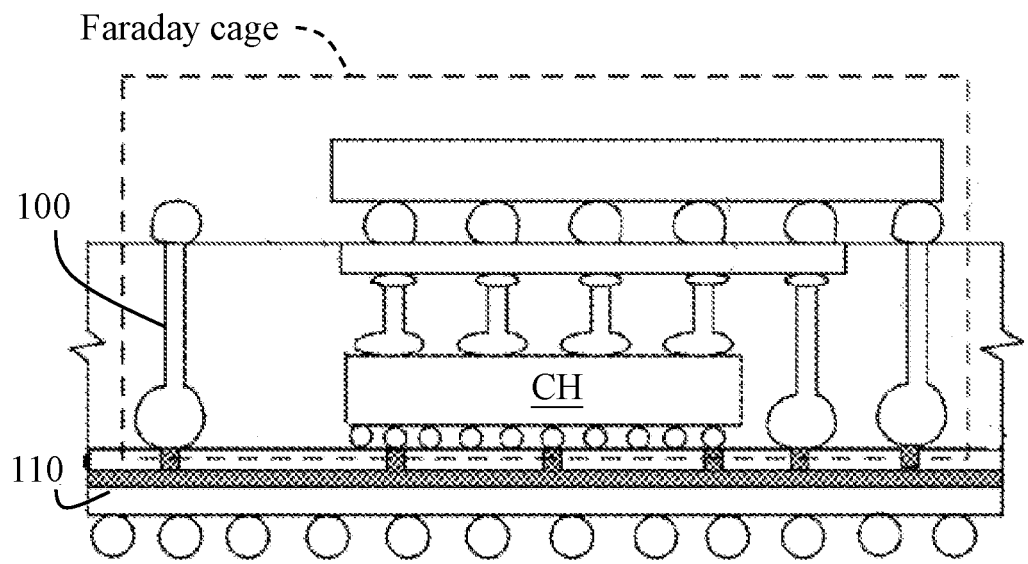
FIGS. 1, 2, and 3 show schematic diagrams of chip unit package structures in the prior arts.
Figure 2:
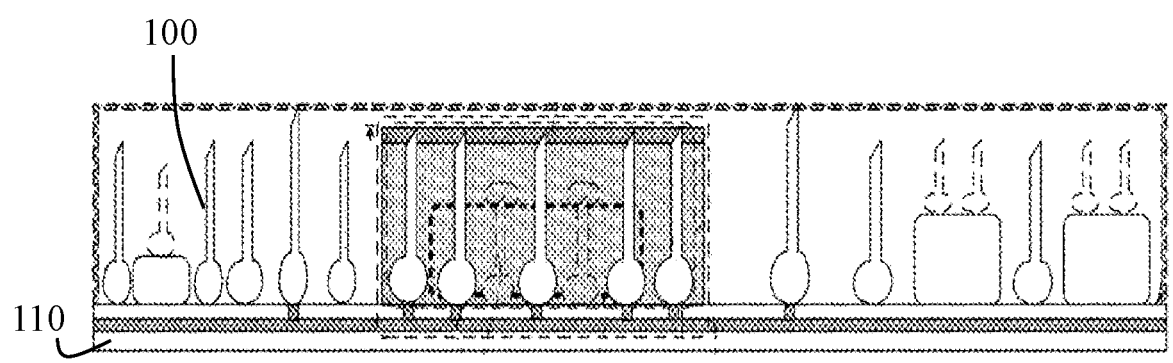
Figure 3:
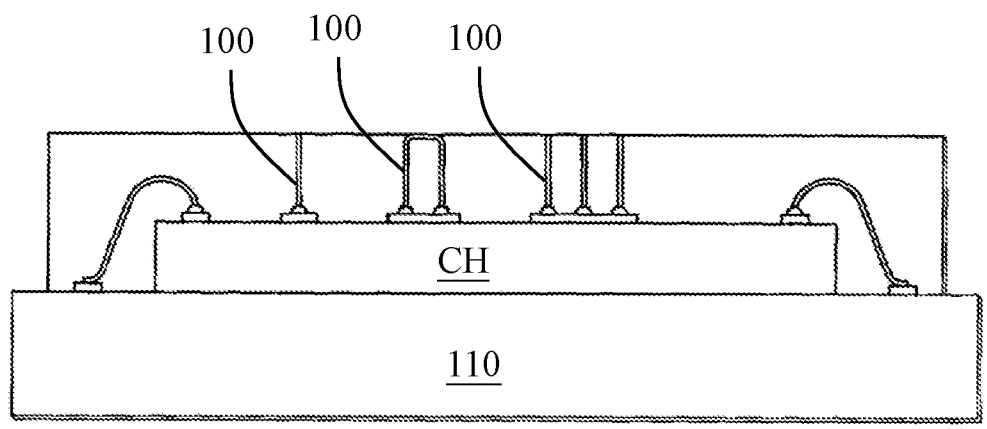
Figure 4A:
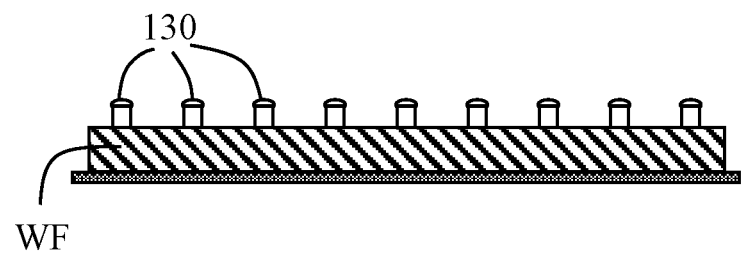
FIGS. 4A to 4F show steps of the chip packaging method according to one embodiment of the invention.
Figure 4B:
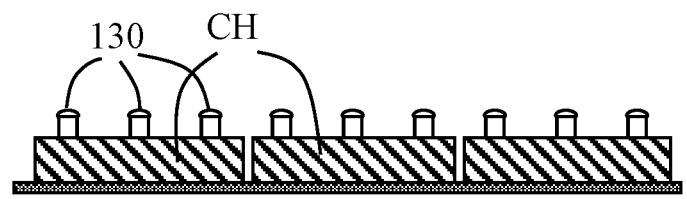
Figure 4C:
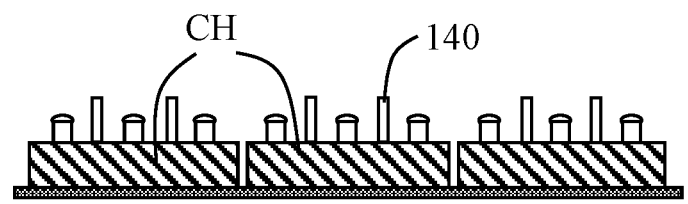
Figure 4D:
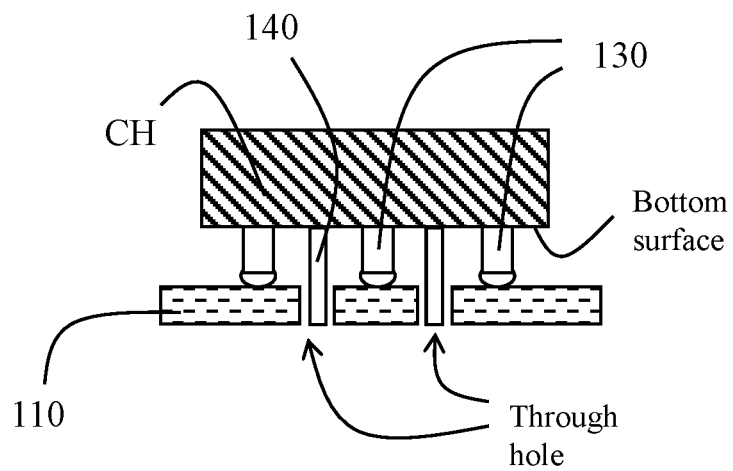
Figure 4E:
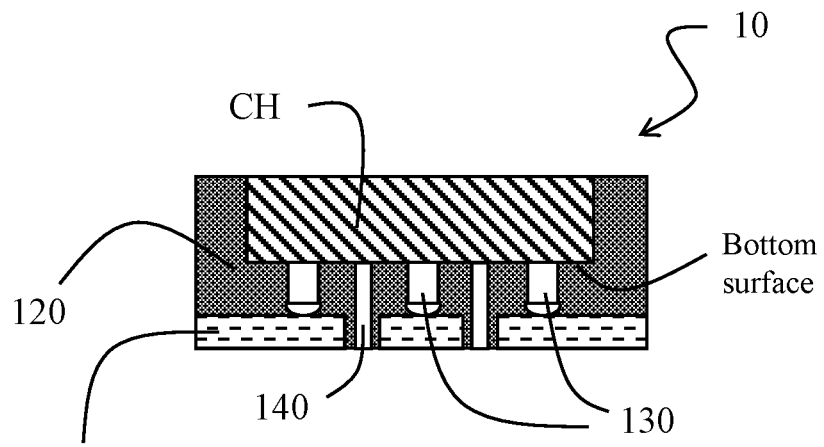

FIGS. 4A to 4E show steps of the chip packaging method according to one embodiment of the present invention, wherein the chip packaging method includes: providing a wafer WF, which includes multiple bumps 130 on the wafer WF (FIG. 4A); cutting the wafer WF into multiple chip units CH (FIG. 4B); forming multiple vertical heat conduction elements 140 on the chip units CH (FIG. 4C); flipping the chip units CH and disposing the chip units CH on a base material 110 (FIG. 4D); providing a package material 120 to encapsulate lateral sides and a bottom surface (facing the base material 110) of the chip units CH, to form a plurality of chip package units 10 (FIG. 4E). In the chip package unit 10, the bumps 130 on the chip unit CH abuts against the base material 110, and the vertical heat conduction elements 140 pass through corresponding through-holes in the base material 110, or in another embodiment, the vertical heat conduction elements 140 directly contact and connect the base material 110. Each of the chip units CH includes at least one bump 130.

Figure 5A:
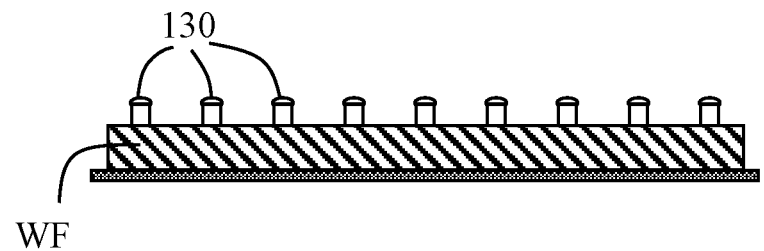
FIGS. 5A to 5F show steps of the chip packaging method according to another embodiment of the present invention.
Figure 5B:
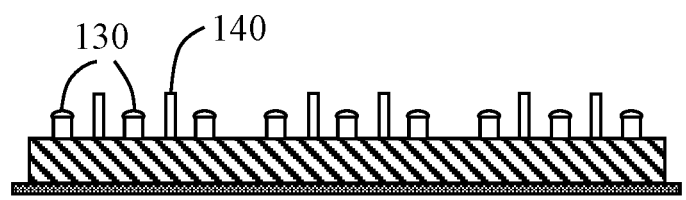
Figure 5C:
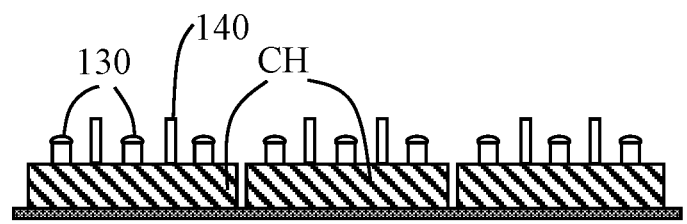
Figure 5D:
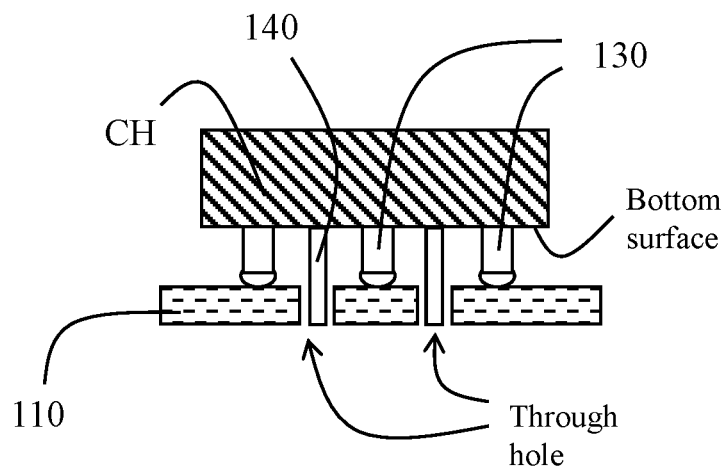
Figure 5E:
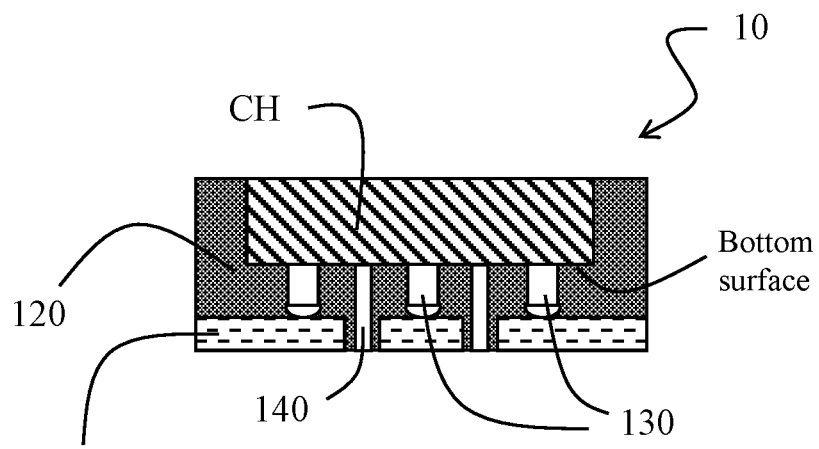
Figure 5F:
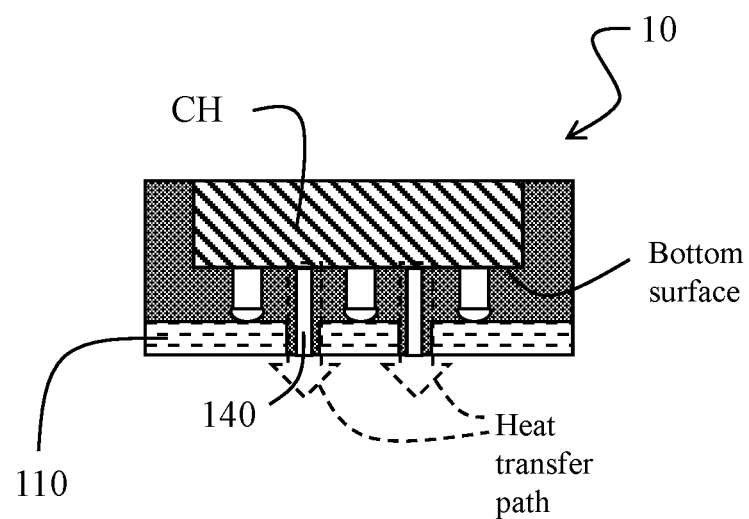

FIGS. 5A to 5E show another embodiment of the present invention, wherein the chip packaging method includes: providing a wafer WF, the wafer WF includes multiple bumps 130 thereon (FIG. 5A); forming multiple vertical heat conduction elements 140 on the wafer WF; cutting the wafer WF into multiple chip units CH (FIGS. 5B and 5C); flipping the chip units CH and disposing the chip units CH on a base material 110 (FIG. 5D); providing a package material 120 to encapsulate lateral sides and a bottom surface (facing the base material 110) of the chip unit CH, to form a plurality of chip package units 10 (FIG. 5E). In the chip package unit 10, the bumps 130 on the chip unit CH abut against the base material 110, and the vertical heat conduction elements 140 pass through corresponding through-holes in the base material 110, or in another embodiment, the vertical heat conduction elements 140 directly contact and connect the base material 110. Each of the chip units CH includes at least one bump 130.

In one embodiment, at least one of the bumps 130 includes an interconnection structure for transmitting signals between the chip unit CH and the base material 110; the interconnection structure for example can be solder balls or other types of connection structures.

In some embodiments, the aforementioned steps of cutting the wafer WF into the chip units CH, disposing the chip units CH on the base material 110, and forming vertical heat conduction elements 140 on the wafer WF or on the chip units cut from the wafer WF, can be embodied in various ways, such as:

(1) cutting the wafer WF into multiple chip units CH (FIGS. 4A, and 4B); forming multiple vertical heat conduction elements 140 on each of the chip units CH (on the same side of the chip unit CH as the bumps 130, FIG. 4C); and then flipping the chip units CH and disposing the chip units CH on the base material 110 (FIG. 4D).

(2) forming multiple vertical heat conduction elements 140 on the wafer WF (on the same side of the chip unit CH as the bumps 130, FIGS. 5A and 5B); thereafter, cutting the wafer WF into multiple chip units CH (FIG. 5C, each of the chip units CH includes the vertical heat conduction elements 140); and then flipping the chip units CH and disposing the chip units CH on the base material 110 (FIG. 5D).

(3) cutting the wafer WF into multiple chip units CH; flipping each chip unit CH and disposing the chip unit CH on the base material 110; forming multiple vertical heat conduction elements 140 on the chip unit CH (on the same side of the chip unit CH as the bumps or on a side of the chip unit CH opposite to the bumps), and connecting the vertical heat conduction elements 140 to the base material 110 (for example, in FIG. 6, the vertical heat conduction elements 140 are connected to the base material 110 to increase the heat transfer efficiency to the base material 110).

The features in the aforementioned three methods can be rearranged in a different combination. For example, in a combination of embodiments (1) and (2), the vertical heat conduction elements 140 can be formed on both the wafer WF and the chip units CH, which is another embodiment within the spirit of the present invention.

In one embodiment, each vertical heat conduction element 140 is a lead wire formed by wire bonding on the wafer WF or the chip unit CH, and in the process for forming the vertical heat conduction element 140, the lead wire is pulled or straightened up in the vertical direction of the chip unit CH. In one embodiment, the vertical heat conduction element 140 is provided as a lead wire formed by wire bonding on a pad of the chip unit CH, wherein the pad is a no connection pad, i.e., there is no signal transmission via this pad from/to the chip unit CH.

Figure 4F:
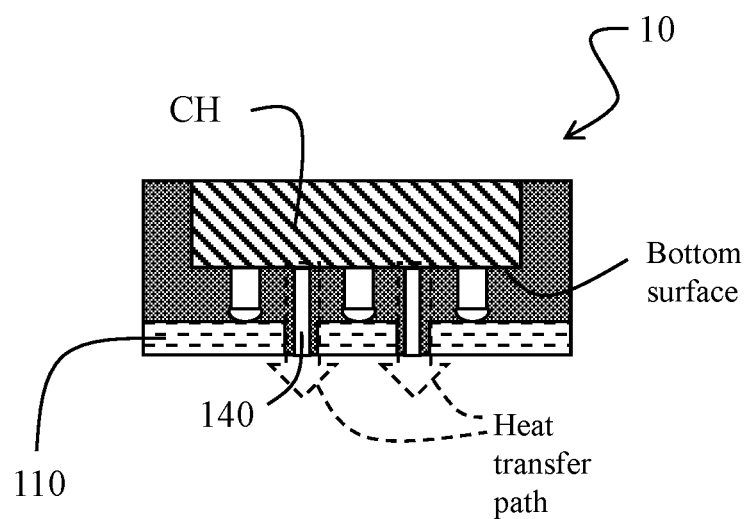

The package material 120 is a material suitable for encapsulating the chip unit CH, which has good encapsulating capability but usually its heat dissipation performance is ordinary. In the present invention, the vertical heat conduction element 140 has a heat transfer coefficient much higher than that of the package material 120; via the vertical heat conduction elements 140, plural heat transfer paths from the chip unit CH to the outside of the chip package unit 10 or 20 are provided (referring FIGS. 4F and 6B, the dashed arrows show examples of the heat transfer paths). In one embodiment, the material of the vertical heat conduction element 140 includes copper, aluminum, silver, nickel, or a composite metal alloy material (e.g., copper alloys, silver alloys, and so on).

As shown in FIGS. 4D and 4E, one side of the vertical heat conduction element 140 is exposed on the surface of the chip package unit 10, which is designed for transferring heat to the outside of the chip package unit 10, via the vertical heat conduction element 140 and the through-hole in the base material 110 that the vertical heat conduction element 140 passes through. The bumps 130 on the chip unit CH abut against the base material 110 (for forming signal communication paths or power paths, for example). The vertical heat conduction elements 140 extend longer than the bumps 130; the vertical heat conduction elements 140 enter and pass through the through-holes but the bumps 130 abut against the base material 110. The package material 120 fills the spaces in the through-holes which are not occupied by the vertical heat conduction elements 140. The vertical heat conduction elements 140 are very close to the base material 110, so the base material 110 can assist dissipating heat in the vertical heat conduction elements 140 through the package material 120. Or in the embodiment of FIGS. 6A and 6B, the vertical heat conduction elements 140 are connected to the base material 110, wherein the vertical heat conduction elements 140 and the base material 110 form heat transfer paths from the chip unit CH to the outside of the chip package unit 20. In the above embodiments, the main heat transfer direction is from the chip unit CH toward the base material 110.

In one embodiment, the chip unit CH is mounted on the base material 110 by flip chip technology. In one embodiment, the base material 110 is a lead frame. In some embodiments, the package method can be: Quad Flat No-Lead (QFN), Dual Flat No-Lead (DFN), Small Outline Transistor (SOT), or Small Out-Line Package (SOP), etc. In the embodiment wherein the base material 110 is a lead frame, each vertical heat conduction element 140 is, for example, a lead wire, extending outwards from the chip unit CH to pass through a gap between the leads in the lead frame.

Figure 6A:
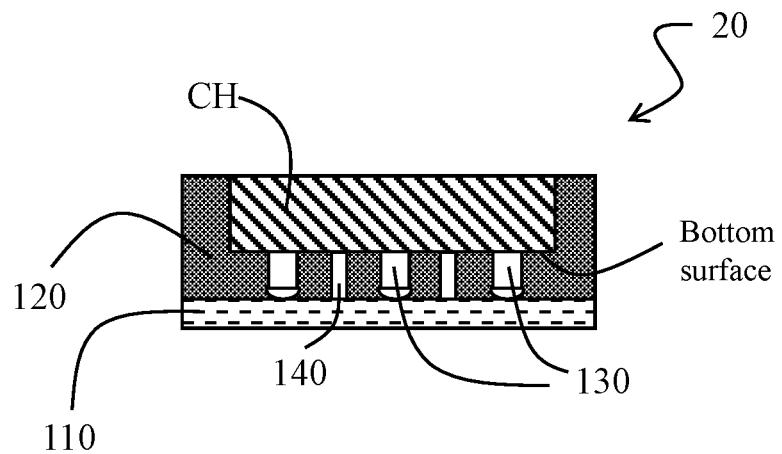
FIGS. 6A and 6B show schematic diagrams of the chip package unit according to one embodiment of the present invention.
Figure 6B:
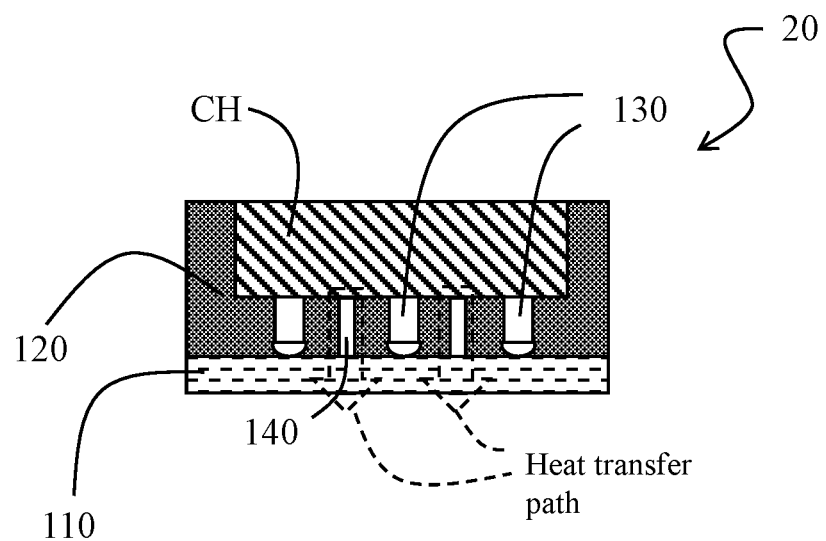

In one perspective, as shown in FIGS. 4E and 6A, the present invention provides a chip package unit 10 or 20, which includes: a lead frame 110; a chip unit CH disposed on the lead frame 110, the chip unit CH including a plurality of bumps 130 and a plurality of vertical heat conduction elements 140, wherein the bumps 130 and the vertical heat conduction elements 140 are formed on the same side of the chip unit CH, and wherein the vertical heat conduction elements 140 pass through multiple through-holes in the lead frame 110 or directly connect the lead frame 110; and a package material 120, encapsulating lateral sides of the chip unit CH and a bottom surface (facing the lead frame 110) of the chip unit CH.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A chip packaging method, including:
   providing a wafer, on which multiple bumps are formed;
   cutting the wafer into multiple chip units, wherein multiple vertical heat conduction elements are formed on the wafer or the chip units;
   disposing the chip units on a base material; and
   providing a package material to encapsulate lateral sides and a bottom surface of each of the chip units, to form a chip package unit, wherein the bottom surface of the chip unit faces the base material;
   wherein, in the chip package unit, the bumps on the chip units abut against the base material, and
   wherein the base material includes multiple through-holes and the vertical heat conduction elements pass through the multiple through-holes in the base material.

2. The chip packaging method according to claim 1, wherein the steps of cutting the wafer into multiple chip units, wherein multiple vertical heat conduction elements are formed on the wafer or the chip units, and disposing the chip units on a base material, are performed according to one of the following orders:
   (1) first cutting the wafer into the multiple chip units; next forming the multiple vertical heat conduction elements on each of the chip units; and next flipping the chip units and disposing the chip units on the base material;
   (2) first forming the multiple vertical heat conduction elements on the wafer; next cutting the wafer into the multiple chip units, wherein each of the chip units includes plural vertical heat conduction elements; and next flipping the chip units and disposing the chip units on the base material; or
   (3) cutting the wafer into the multiple chip units; next disposing the chip units on the base material; and next flipping the chip units and provide the multiple vertical heat conduction elements to pass through the multiple through-holes in the base material.

3. The chip packaging method according to claim 1, wherein the vertical heat conduction elements are lead wires formed on the wafer or the chip units by wire bonding, and the lead wires are pulled or straightened up in a vertical direction of the chip unit.

4. The chip packaging method according to claim 3, wherein the vertical heat conduction elements are lead wires formed on pads of the chip unit, wherein the pads are no-connection pads by which no signal or power transmission is performed.

5. The chip packaging method according to claim 1, wherein one side of each of the vertical heat conduction elements is exposed on a surface of the chip package unit, or the vertical heat conduction elements pass through the multiple through-holes in the base material, to form heat transfer paths from the chip unit to outside of the chip package unit.

6. The chip packaging method according to claim 1, wherein the chip unit is mounted on the base material by flip chip technology.

7. The chip packaging method according to claim 1, wherein a heat transfer coefficient of a material of the vertical heat conduction elements is higher than a heat transfer coefficient of the package material.

8. The chip packaging method according to claim 1, wherein material of the vertical heat conduction elements includes copper, aluminum, silver, nickel, or a composite metal alloy material.

9. The chip packaging method according to claim 1, wherein each of the chip units is electrically connected to the base material through the bumps.

10. The chip packaging method according to claim 1, wherein the base material is a lead frame.

11. The chip packaging method according to claim 1, wherein the chip packaging method is applied to: quad flat no-lead package, dual flat no-lead package, small outline transistor, or small out-line package.

12. The chip packaging method according to claim 1, wherein in each of the chip package units, the vertical heat conduction elements are formed on a side of the chip unit facing the base material.

* * * * *